(12) United States Patent
Feld et al.

(10) Patent No.: US 6,844,730 B2
(45) Date of Patent: Jan. 18, 2005

(54) MAGNETIC RESONANCE APPARATUS, AND COIL ARRANGEMENT AND RECEPTION CIRCUIT THEREFOR ENABLING FREQUENCY MODULATION WITH A SINGLE TRANSMISSION CABLE

(75) Inventors: Peter Feld, Nuremberg (DE); Wolfgang Renz, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 107 days.

(21) Appl. No.: 10/262,330

(22) Filed: Oct. 1, 2002

(65) Prior Publication Data

US 2003/0076105 A1 Apr. 24, 2003

(30) Foreign Application Priority Data

Oct. 1, 2001 (DE) .......................................... 101 48 467

(51) Int. Cl.⁷ ................................................. G01V 3/00
(52) U.S. Cl. ........................................ 324/318; 324/322
(58) Field of Search ................................ 324/318, 322, 324/309, 307

(56) References Cited

U.S. PATENT DOCUMENTS

| | | | | |
|---|---|---|---|---|
| 4,763,075 A | | 8/1988 | Weigert | 324/318 |
| 4,994,746 A | * | 2/1991 | Panosh | 324/322 |
| 5,384,536 A | * | 1/1995 | Murakami et al. | 324/309 |
| 5,550,471 A | | 8/1996 | Feld | 324/318 |
| 6,084,410 A | | 7/2000 | Nistler | 324/318 |
| 2003/0076105 A1 | * | 4/2003 | Feld et al. | 324/322 |

FOREIGN PATENT DOCUMENTS

DE         41 26 537         2/1993

* cited by examiner

Primary Examiner—Diego Gutierrez
Assistant Examiner—Tiffany A. Fetzner
(74) Attorney, Agent, or Firm—Schiff Hardin LLP

(57) ABSTRACT

A coil arrangement for a magnetic resonance system has a resonator that is followed by a modulator with which a magnetic resonance signal of the resonator is modulated onto a carrier frequency. An infeed element follows the modulator with which that magnetic resonance signal modulated onto the carrier frequency is supplied into a single transmission cable. In a corresponding reception circuit, an analog-to-digital converter is preceded by a demodulator with which the magnetic resonance signal is demodulated.

40 Claims, 3 Drawing Sheets

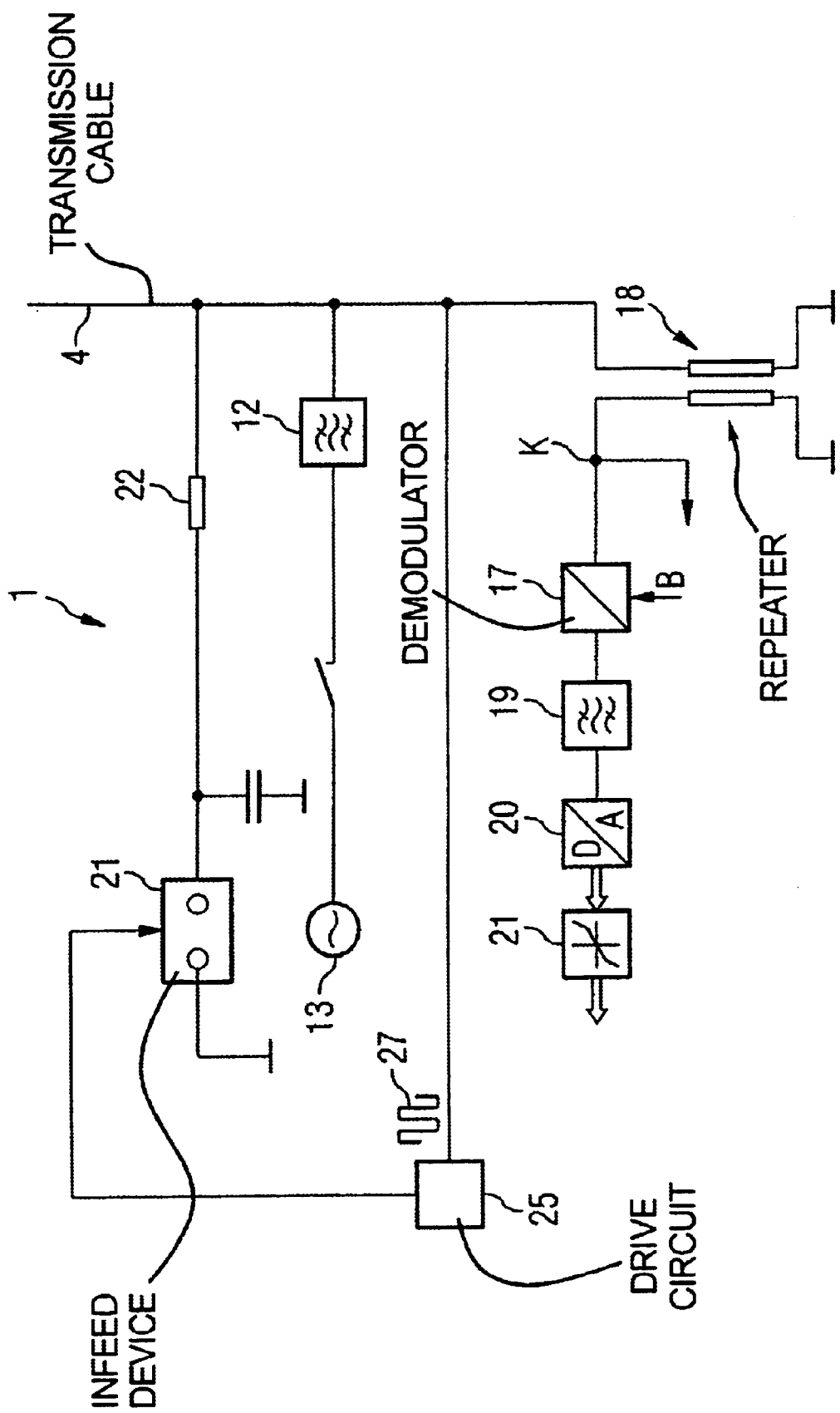

MAGNETIC RESONANCE APPARATUS, AND COIL ARRANGEMENT AND RECEPTION CIRCUIT THEREFOR ENABLING FREQUENCY MODULATION WITH A SINGLE TRANSMISSION CABLE

BACKGROUND OF THE INVENTION

1. Field of the Invention

The present invention is directed to a coil arrangement for a magnetic resonance installation, having a coil for obtaining a magnetic resonance signal that can be fed into a transmission cable. It is also directed to a reception circuit having an analog-to-digital converter to which the magnetic resonance signal of the coil can be supplied via the transmission cable. The present invention also is directed to a magnetic resonance installation having these components.

2. Description of the Prior Art

In magnetic resonance installations, a number of coil arrangements usually are required for the signal acquisition. Each coil arrangement is connected to the reception circuit via its own cable. In practice, this leads to a number of cables to be laid, with a sheath wave barrier additionally required per cable.

This known procedure is complicated, work-intensive and cost-intensive and is susceptible to error.

SUMMARY OF THE INVENTION

An object of the present invention is to provide a coil for a magnetic resonance installation and a reception circuit corresponding therewith wherein the cabling can be considerably reduced.

This object is achieved in accordance with the invention in a coil arrangement wherein the coil is followed by a modulator with which the magnetic resonance signal can be modulated onto a carrier frequency, and wherein the modulator is followed by an infeed element with which the magnetic resonance signal modulated onto the carrier frequency can be fed into a single transmission cable.

The object also is achieved in accordance with the invention in a reception circuit wherein the analog-to-digital converter is preceded by a demodulator with which the magnetic resonance signal, modulated onto the carrier frequency and supplied to the reception circuit via the transmission cable, can be demodulated.

The carrier frequency of the modulator can be fixed, however, preferably it is variable, manually or via control commands. The carrier frequency of the demodulator also is preferably variable. In particular, it is not required to provide a number of parallel circuits of demodulators; rather, the demodulator need only be suitably set.

When the modulator is preceded by a frequency filter for band-pass filtering of the magnetic resonance signal, an unambiguous separation of this signal is possible in the reception circuit. The separation is even further improved when a frequency filter additionally follows the demodulator. The frequency filter in the coil arrangement has a center frequency equal to the Larmor frequency.

A mixer with which the filter magnetic resonance signal can be mixed with a base frequency can be arranged between the modulator and the frequency filter, making the frequency range to be modulated smaller. An even better separation of the appertaining, modulated signal is therefore possible in the reception circuit. This is particularly true when the base frequency lies in the proximity of the Larmor frequency. In this case, in particular, it is possible for the demodulated magnetic resonance signal to be band-pass filtered with the frequency filter following the demodulator at an intermediate frequency that is significantly lower than the Larmor frequency. Further, it is possible in this case for the analog-to-digital converter of the reception circuit to have a limit frequency that is significantly lower than the Larmor frequency.

The mixer can be followed by an intermediate band-pass for filtering out a sum frequency of the Larmor frequency and the base frequency. Disturbances due to the sum frequency thus are precluded.

It is possible to generate the base frequency within the coil arrangement. Preferably, however, the base frequency can be supplied to the mixer via the transmission cable. This is particularly true because the base frequency then can be the same for all coil arrangements and is also known to the reception circuit. Preferably, a frequency generator which emits the base frequency at an output is a component of the reception circuit.

A frequency filter for filtering out the base frequency from the signal in the transmission cable can be arranged between the mixer and the transmission cable. Other frequencies that could possibly have a disturbing influence on the signal supplied to the modulator then are already filtered out. Preferably, a frequency filter is also arranged between the frequency generator and the transmission cable.

The modulator can be preceded by a dynamics compressor, making the required modulation range of the modulator is smaller. Further, only a smaller signal-to-noise ratio is required. Distortion of the magnetic resonance signal that is caused by the compression is compensated with a corresponding decompressor following the analog-to-digital converter of the reception circuit.

The modulator can be preceded by an input band-pass for filtering the signal to be supplied to the modulator. The modulator additionally can be followed by an output band-pass for filtering the signal output by the modulator, making the band limitation even narrower.

The modulator and/or the demodulator can be coupled to the transmission cable via a repeater. When the coil arrangement is supplied with energy via the transmission cable, the cabling can be reduced even farther. Correspondingly, the reception circuit preferably has an infeed device for feeding energy into the transmission cable.

The coil arrangement can have a control circuit to which control commands can be supplied via the transmission cable, allowing the cabling to be reduced even farther. Correspondingly, the reception circuit preferably has a drive circuit with which control commands can be supplied into the transmission cable.

The control circuit can be galvanically connected to the transmission cable, and the level and/or the operational sign of a supply voltage supplied to the coil arrangement via the transmission cable can be acquired for determining a predetermined control signal. Correspondingly, the control circuit can vary the level and/or the operational sign of the supply voltage supplied into the transmission cable in this case for feeding a predetermined control signal.

The control circuit can evaluate an alternating voltage signal supplied to the coil arrangement via the transmission cable for determining control signals, allowing the transmission of a number of control commands in a simple and easy way. Correspondingly, the drive circuit feeds an alternating voltage signal into the transmission cable for supplying control signals.

The control circuit can be preceded by a frequency filter, allowing the control commands to be separated from other frequency signals in an especially simple and dependable way.

The coil can be a local coil of a magnetic resonance examination apparatus.

The modulator and the demodulator can be fashioned as frequency modulators or as frequency converters.

DESCRIPTION OF THE DRAWINGS

FIG. 3 is a schematic block diagram of a reception circuit for a magnetic resonance examination apparatus constructed in accordance with the present invention.

DESCRIPTION OF THE PREFERRED EMBODIMENTS

Figure 1:
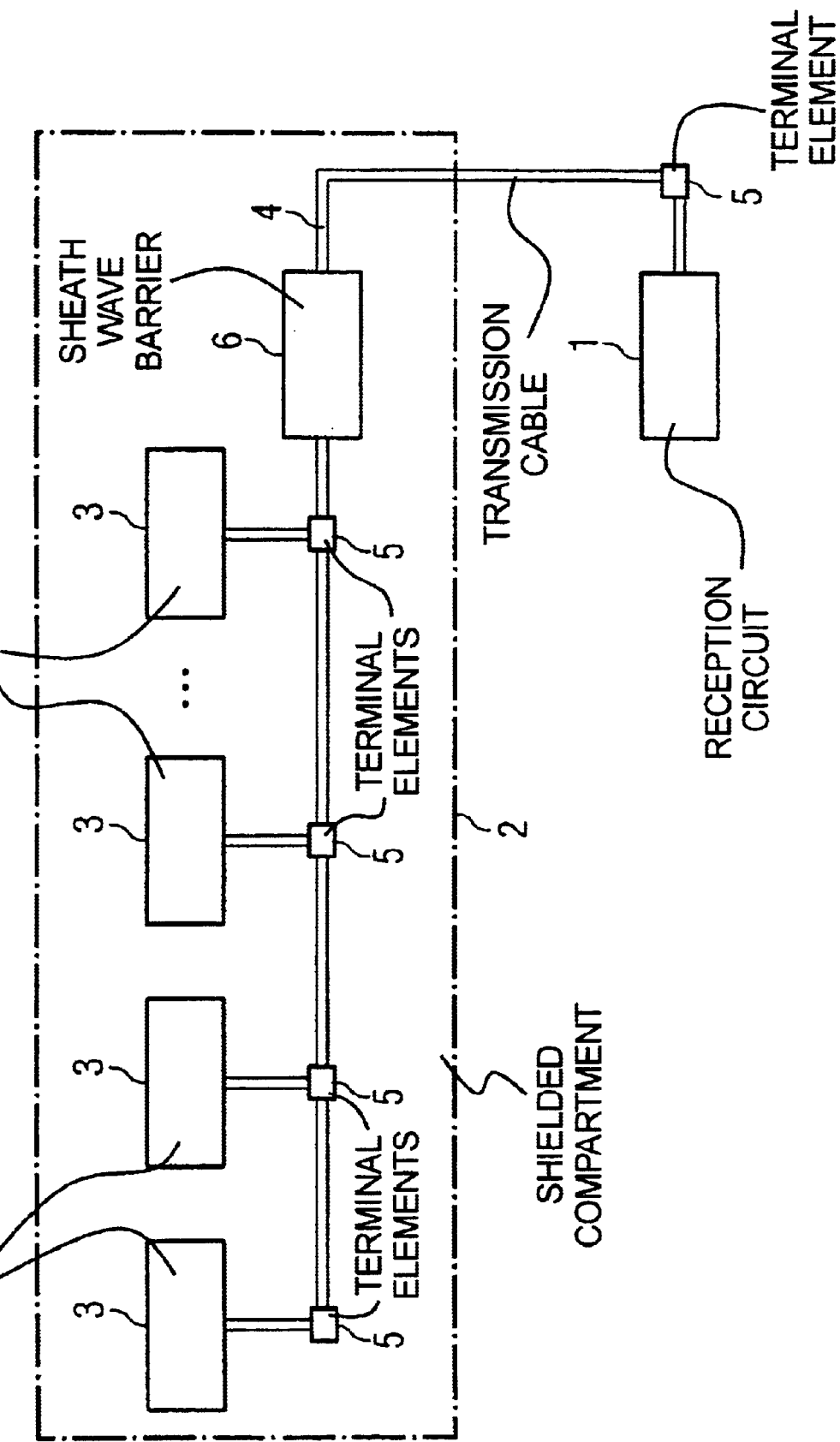
FIG. 1 is a schematic block diagram of a magnetic resonance examination apparatus constructed in accordance with the present invention.

As shown in FIG. 1, a magnetic resonance installation has a reception circuit 1. The reception circuit 1 is arranged outside a shielded compartment 2. A number of coil arrangements 3 are arranged within the shielded compartment 2, these being connected to the reception circuit 1 via a common transmission cable 4 and corresponding terminal elements 5. The transmission cable 4 preferably is a coaxial cable. At least one sheath-wave barrier 6 is present in the transmission cable 4 and is arranged between the coil arrangements 3 and the reception circuit 1.

Figure 2:
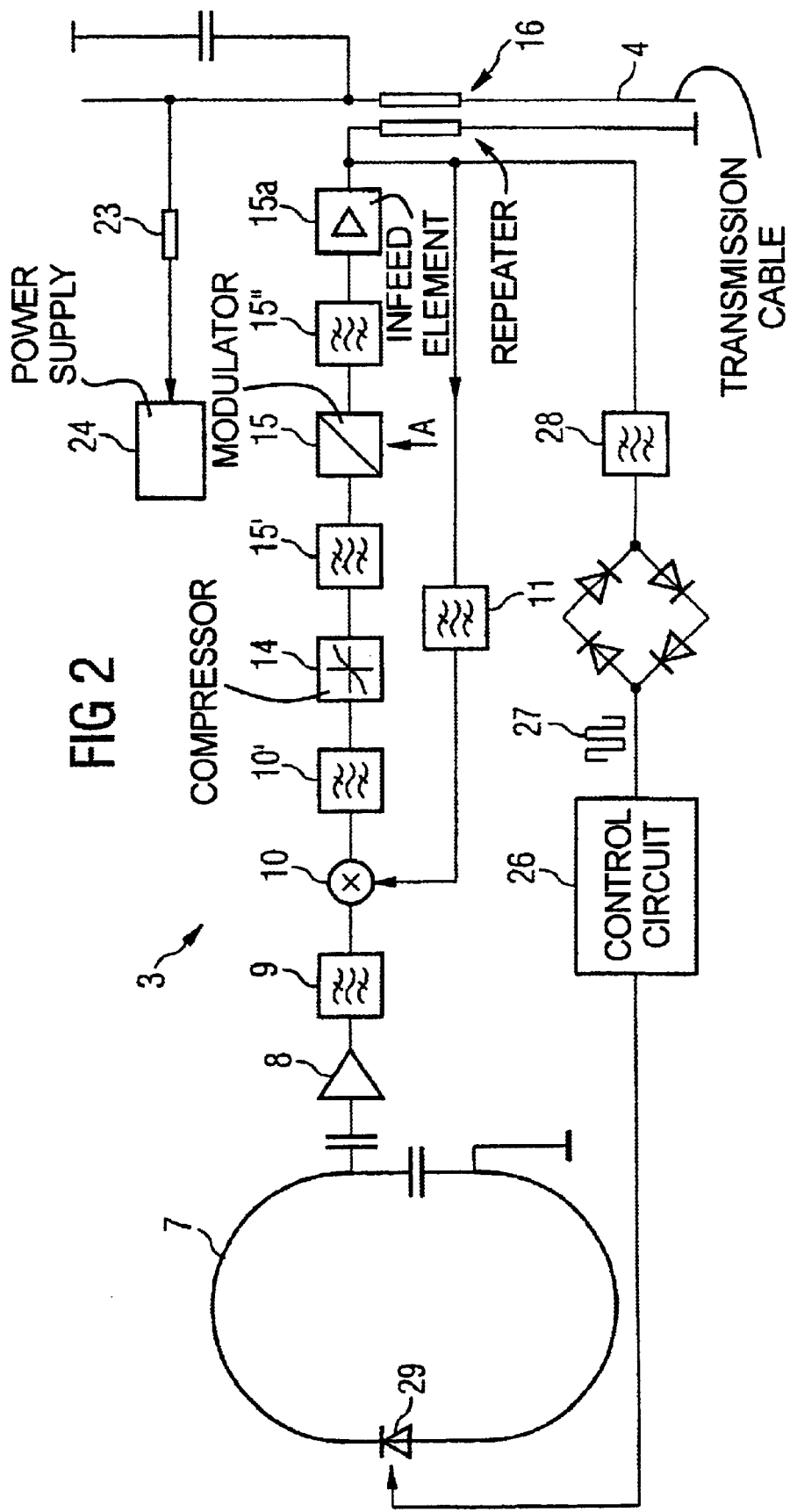
FIG. 2 is a schematic block diagram of a coil arrangement for a magnetic resonance examination apparatus constructed in accordance with the present invention.

According to FIG. 2, each of the coil arrangements 3 includes a resonator 7. The resonator 7 can be a coil that is stationarily mounted in the magnetic resonance installation. Preferably, however, the resonator 7 is a local coil.

The resonator 7 is followed by a pre-amplifier 8. The output signal thereof is supplied to a frequency filter 9. In the frequency filter 9, the pre-amplified output signal of the coil 7, i.e. the magnetic resonance signal, is band-pass filtered. The frequency filter 9 ha a center frequency equal to the Larmor frequency.

From the frequency filter 9, the filtered magnetic resonance signal is supplied to a mixer 10. In the mixer 10, the filtered magnetic resonance signal is mixed with a base frequency. The base frequency is supplied to the mixer 10 via a further frequency filter 11 and via the transmission cable 4. The base frequency is filtered out with the frequency filter 11. Only the base frequency thus is allowed to pass; the frequency filter 11 blocks all other frequencies.

The base frequency is supplied into the transmission cable 4 via a frequency filter 12 from a frequency generator 13 according to FIG. 3. The frequency generator 13 and the frequency filter 12 are components of the reception circuit 1 according to FIG. 3.

The Larmor frequency usually is between 8 and 125 MHz, dependent on the intensity of the basic magnetic field. For a basic magnetic field of 1.5 T, for example, it is at 63.6 MHz. The base frequency preferably is in the proximity of the Larmor frequency. The difference between these two frequencies should amount, for example, to between 1 and 3 MHz, for example 1.4 MHz.

The output signal of the mixer 10 is supplied via an intermediate band-pass filter 10' to a dynamics compressor 14. The intermediate band-pass 10' is tuned to the difference between Larmor frequency and base frequency. Only frequencies in this range are allowed to pass. All other frequencies, particularly the sum of Larmor frequency and base frequency, are filtered out.

Finally, the output signal of the dynamics compressor 14 is supplied via an input band-pass filter 15' to a modulator 15. The resulting signal is modulated onto a carrier frequency with this modulator 15. The signal modulated onto the carrier frequency is supplied via an output band-pass 15" to an infeed element 15a. From the infeed element 15a, the magnetic resonance signal modulated onto the carrier frequency is supplied into the transmission cable 4 via a repeater 16.

The carrier frequency usually is in the GHz range, for example between 1 and 2 GHz. It is unique for each of the respective coil arrangements 3. Directly neighboring carrier frequencies, for example, exhibit a frequency difference between 50 and 100 MHz. The carrier frequency of each coil arrangement 3 can be permanently prescribed. Preferably, however, the carrier frequency is variable, as indicated by an arrow A in FIG. 2.

According to FIG. 3, the reception circuit 1 has a demodulator 17 that is likewise coupled to the transmission cable 4 via a repeater 18. The modulated magnetic resonance signal supplied into the transmission cable 4 by the modulator 15 is demodulated by the demodulator 17. For selecting the coil arrangements 3, the carrier frequency of the demodulator 17 is variable. This is indicated by an arrow B in FIG. 3

The demodulator 17 is followed by a frequency filter 19. In the frequency filter 19, the demodulated magnetic resonance signal is band-pass filtered at an intermediate frequency. The intermediate frequency is the center frequency of the demodulated magnetic resonance signal, and is considerably lower than the Larmor frequency, and in fact is equal to the difference between the base frequency and the Larmor frequency. The demodulated magnetic resonance signal thus typically lies in the range between 1 and 3 MHz.

The output signal of the frequency filter 19 is supplied to an analog-to-digital converter 20. Therein, a digitization of the analog magnetic resonance signal ensues. Of course, the analog-to-digital converter 20 must have a limit frequency that is significantly higher than the frequency range in which the demodulated magnetic resonance signal lies. The limit frequency, however, can be significantly lower than the Larmor frequency. For example, the limit frequency of the analog-to-digital converter 20 can lie at 10 MHz.

The analog-to-digital converter 20 is followed by a decompressor 21. A compensation of the compression of the dynamics compressor ensues with the decompressor 21.

The demodulator 17 and the components 19 through 21 following thereafter can be multiply present, as warranted. This is indicated in FIG. 3 by a node K via which the further demodulators 17 can be connected to the repeater 18. In this case, of course, each demodulator 17 is tuned to a different carrier frequency.

The reception circuit 1 according to FIG. 3 further has an infeed device 30. Energy can be supplied into the transmission cable 4 with the infeed device 30 via an inductor 22. According to FIG. 2, it is thus possible to supply the coil arrangements 3 with energy via the transmission cable 4 and a further inductor 23. The inductor 23 is connected to a power supply 24 according to FIG. 2 from which the further distribution of the electrical energy can ensue to other loads.

The reception circuit 1 according to FIG. 3 also has a drive circuit 25. The drive circuit 25 supplies control commands into the transmission cable 4. Correspondingly, each of the coil arrangements 3 has a control circuit 26 that can evaluate and implement the control commands supplied via the transmission cable 4.

When the control circuit 26 is galvanically connected to the transmission cable 4 either directly or, for example, via the power supply 24, it is possible for the drive circuit 25 to drive the infeed device 21. As a result, for example, the level and/or the operational sign of the supply voltage supplied into the transmissions cable 4 can be varied. The control circuit 26 then acquires the level and/or the operational sign of the supply voltage and determines a predetermined control signal therefrom.

Alternatively or additionally, the drive circuit 25, as indicated by a wave train 27 in FIG. 3, can feed an alternating voltage signal into the transmission cable 4. In this case, the control circuit 26 of the coil arrangement 3 identifies the control signals from the alternating voltage signal supplied via the transmission cable 4. It thus interprets the alternating voltage signal. The alternating voltage signal preferably is in a frequency range that is clearly separated from the GHz range of the carrier frequency as well as from the 60 MHz range of the Larmor frequency and the base frequency. Typically, it is considerably lower in frequency and is in the kHz range. Particularly in this case, it is possible to precede the control circuit 26 with a frequency filter 28 that, of course, is tuned to the kHz range.

A number of control commands can be communicated with alternating voltage curves. For example, it is possible to supply the control circuit 26 with a control command on the basis of which a PIN diode 29 that is looped into the coil 7 is driven. As a result, the resonator 7 is detuned. This allows individual coil arrangements 3 to be blanked out of the possible reception coil arrangements by means thereof.

While avoiding electro-magnetic shielding problems, it is easy with the present invention to connect a number of coil arrangements 3 to a common reception circuit 1 via a common (single) transmission cable 4.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance system coil arrangement comprising:
    a resonator which receives a magnetic resonance signal;
    a modulator connected to said resonator modulating said magnetic resonance signal onto a carrier frequency, thereby producing a frequency modulated magnetic resonance signal;
    a single transmission cable; and
    an infeed element connected to said modulator supplying said frequency modulated magnetic resonance signal to said single transmission cable.

2. A coil arrangement as claimed in claim 1 wherein said carrier frequency of said frequency modulator is variable.

3. A coil arrangement as claimed in claim 1 further comprising a bandpass filter connected between said resonator and said modulator which bandpass filters said magnetic resonance signal from said resonator.

4. A coil arrangement as claimed in claim 3 wherein said frequency filter has a center frequency equal to a Larmor frequency.

5. A coil arrangement as claimed in claim 3 wherein said frequency filter produces a filtered magnetic resonance signal, and further comprising a mixer connected between said frequency filter and said modulator that mixes said filtered magnetic resonance signal with a base frequency.

6. A coil arrangement as claimed in claim 5 wherein said mixer produces a mixer output, and further comprising an intermediate bandpass filter connected between said mixer and said modulator filtering out a sum frequency of said Larmor frequency and said base frequency from said mixer output.

7. A coil arrangement as claimed in claim 5 wherein said base frequency differs from said Larmor frequency by a difference in a range between 1 and 3 MHz.

8. A coil arrangement as claimed in claim 5 wherein said mixer is connected to said single transmission cable and wherein said base frequency is supplied to said mixer via said single transmission cable.

9. A coil arrangement as claimed in claim 8 comprising a further frequency filter connected between said mixer and said transmission cable filtering said base frequency out of a signal in said transmission cable.

10. A coil arrangement as claimed in claim 1 further comprising a dynamics compressor connected between said resonator and said modulator.

11. A coil arrangement as claimed in claim 1 further comprising an input bandpass filter connected between said resonator and said modulator that filters out an input signal to said modulator from said magnetic resonance signal provided by said resonator.

12. A coil arrangement as claimed in claim 1 wherein said modulator has an output at which a modulator output comprising an output bandpass filter connected to said output of said modulator which filters said modulator output.

13. A coil arrangement as claimed in claim 1 further comprising a repeater coupling said infeed element to said transmission cable.

14. A coil arrangement as claimed in claim 1 further comprising a power supply connection at least between said transmission cable and said resonator supplying energy at least to said modulator via said transmission cable.

15. A coil arrangement as claimed in claim 1 further comprising a control circuit connected at least to said resonator which controls said resonator dependent on control signals supplied to said control circuit via said single transmission cable.

16. A coil arrangement as claimed in claim 15 wherein said control circuit is galvanically connected to said transmission cable and wherein said transmission cable supplies a supply voltage, having a level and an operational sign, to said resonator, and wherein said control circuit employs at least one of said level and said operational sign in determining said control signals.

17. A coil arrangement as claimed in claim 15 wherein said transmission cable supplies an alternating voltage signal to said coil arrangement, and wherein said control circuit evaluates said alternating voltage signal in determining said control signals.

18. A coil arrangement as claimed in claim 17 further comprising a frequency filter connected between said control circuit and said single transmission cable.

19. A coil arrangement as claimed in claim 15 wherein said resonator is detuneable by said control circuit.

20. A coil arrangement as claimed in claim 1 wherein said resonator is a magnetic resonance local coil.

21. A magnetic resonance signal reception circuit comprising:
    a terminal element configured to connect to a single transmission cable;

a demodulator connected to said terminal element and receiving therefrom a frequency modulated magnetic resonance signal, modulated onto a carrier frequency, which produces a demodulated magnetic resonance signal; and an analog-to-digital converter connected to said demodulator and supplied with said demodulated magnetic resonance signal therefrom.

22. A reception circuit as claimed in claim 21 wherein said demodulator has a variable carrier frequency.

23. A reception circuit as claimed in claim 21 further comprising a frequency generator connected to said single transmission cable which generates an output signal having a base frequency.

24. A reception circuit as claimed in claim 23 further comprising a frequency filter connected between said frequency generator and said transmission cable.

25. A reception circuit as claimed in claim 23 wherein said bas frequency differs from a Larmor frequency by a difference in a range between 1 and 3 MHz.

26. A reception circuit as claimed in claim 25 further comprising a frequency filter connected between said demodulator and said analog-to-digital converter.

27. A reception circuit as claimed in claim 26 wherein said frequency filter bandpass filters said demodulated magnetic resonance signal at an intermediate frequency that is significantly below said Larmor frequency.

28. A reception circuit as claimed in claim 27 wherein said intermediate frequency of said frequency filter is equal to said difference between said base frequency and said Larmor frequency.

29. A reception circuit as claimed in claim 27 wherein said analog-to-digital converter has a limit frequency that is significantly below said Larmor frequency.

30. A reception circuit as claimed in claim 29 wherein said limit frequency of said analog-to-digital converter is significantly above said intermediate frequency.

31. A reception circuit as claimed in claim 21 further comprising a dynamic decompressor connected to an output of said analog-to-digital converter.

32. A reception circuit as claimed in claim 21 further comprising a repeater coupling said demodulator to said terminal element.

33. A reception circuit as claimed in claim 21 further comprising an infeed device configured to connect to said single transmission cable and to feed energy into said transmission cable.

34. A reception circuit as claimed in claim 21 further comprising a drive circuit configured to connect to said single transmission cable and to supply control commands to said single transmission cable.

35. A reception circuit as claimed in claim 21 further comprising an infeed device configured to connect to said single transmission cable and to feed energy into said transmission cable as a supply voltage having a level and an operational sign, and further comprising a drive circuit configured to connect to said single transmission cable and to supply control commands to said transmission cable by varying at least one of said level and said operational sign.

36. A reception circuit as claimed in claim 34 wherein said drive circuit feeds an alternating voltage signal into said single transmission cable representing said control commands.

37. A magnetic resonance system comprising:

a resonator obtaining an analog magnetic resonance signal;

a modulator connected to said resonator modulating said magnetic resonance signal onto a carrier frequency, thereby producing a frequency modulated magnetic resonance signal;

a single transmission cable having a first end and a second end;

an infeed element connected between said first end of said single transmission cable and said modulator that feeds said frequency modulated magnetic resonance signal into said first end of said single transmission cable;

a demodulator connected to said second end of said single transmission cable receiving said frequency modulated magnetic resonance signal from said single transmission cable and demodulating said frequency modulated magnetic resonance signal, producing a demodulated signal; and an analog-to-digital converter connected to said demodulator and supplied with said demodulated signal therefrom.

38. A magnetic resonance system as claimed in claim 37 further comprising:

a first control circuit connected to said second end of said single transmission cable supplying control commands into said single transmission cable; and a second control circuit connected between said first end of said single transmission cable and said resonator, said second control circuit receiving said control commands from said single transmission cable and operating said resonator dependent on said control commands.

39. A magnetic resonance system as claimed in claim 37 further comprising:

a power supply connected to said second end of said single transmission cable which supplies energy into said single transmission cable; and a power supply connection between said first end of said single transmission cable and said resonator which supplies said energy from said single transmission cable at least to said modulator.

40. A magnetic resonance system as claimed in claim 37 further comprising:

a frequency generator connected to said second end of said single transmission cable generating a signal having a base frequency; and a mixer connected to said first end of said single transmission cable and supplied with said signal having said base frequency from said single transmission cable and generating said carrier frequency therefrom.

* * * * *